(12) United States Patent
Xu

(10) Patent No.: US 9,368,562 B2
(45) Date of Patent: Jun. 14, 2016

(54) ARRAY SUBSTRATE AND A DISPLAY PANEL HAVING THE SAME

(71) Applicant: SHENZHEN CHINA STAR OPTOELECTRONICS TECHNOLOGY CO., LTD., Shenzhen, Guangdong (CN)

(72) Inventor: Xiangyang Xu, Shenzhen (CN)

(73) Assignee: SHENZHEN CHINA STAR OPTOELECTRONICS TECHNOLOGY CO., LTD., Shenzen (CN)

( * ) Notice: Subject to any disclaimer, the term of this patent is extended or adjusted under 35 U.S.C. 154(b) by 23 days.

(21) Appl. No.: 14/382,096

(22) PCT Filed: May 19, 2014

(86) PCT No.: PCT/CN2014/077777
§ 371 (c)(1),
(2) Date: Aug. 29, 2014

(87) PCT Pub. No.: WO2015/172397
PCT Pub. Date: Nov. 19, 2015

(65) Prior Publication Data
US 2015/0333114 A1    Nov. 19, 2015

(30) Foreign Application Priority Data

May 15, 2014 (CN) .......................... 2014 1 0204677

(51) Int. Cl.
*H01L 27/32* (2006.01)
*G09G 3/32* (2016.01)

(52) U.S. Cl.
CPC .............. *H01L 27/3262* (2013.01); *G09G 3/32* (2013.01); *G09G 3/3225* (2013.01); *H01L 27/3211* (2013.01); *H01L 27/3265* (2013.01); *H01L 27/3276* (2013.01); *G09G 2320/043* (2013.01); *G09G 2330/021* (2013.01)

(58) Field of Classification Search
CPC ........................ H01L 27/1214; H01L 27/3262
See application file for complete search history.

(56) References Cited

U.S. PATENT DOCUMENTS

2010/0309178 A1* 12/2010 Tomida ................ G09G 3/3233
345/205

* cited by examiner

*Primary Examiner* — Yu-Hsi D Sun
(74) *Attorney, Agent, or Firm* — Sughrue Mion, PLLC

(57) ABSTRACT

An array substrate and a display panel are disclosed. The array substrate comprises a plurality of first pixel units and a plurality of second pixel units. The first pixel units and the second pixel units are disposed interlaced. A first input terminal of a driving circuit of a sub-pixel unit of each of the first pixel unit receives a first pulse signal, and a second input terminal of the driving circuit of the sub-pixel unit of each of the first pixel unit receives a second pulse signal. The phases of first pulse signal and the second pulse signal are reversed, making the first pixel units and the second pixel units to be driven alternatingly. Power efficiency is increased and the life of a pixel unit is prolonged.

28 Claims, 4 Drawing Sheets

ARRAY SUBSTRATE AND A DISPLAY PANEL HAVING THE SAME

CROSS REFERENCE TO RELATED APPLICATIONS

This is a National Stage of International Application No. PCT/CN2014/077777 filed May 19, 2014, claiming priority based on Chinese Patent Application No. 201410204677.7 filed May 15, 2014, the contents of all of which are incorporated herein by reference in their entirety.

BACKGROUND OF THE INVENTION

1. Field of Invention

The present invention relates to a field of display technology, in particular, to an array substrate and a display panel having the same.

2. Description of Prior Art

Compared with an LCD panel of the prior art, an AMOLED (Active Matrix Organic Light Emitting Diode) display panel has many advantages such as fast response, high contrast, and a wide viewing angle. So, AMOLED has become a popular technology in the field of display technology.

For example, OLED (organic light emitting diode), LED (light emitting diode) and etc. . . . are driven to light by a current which is generated by a driven transistor when the driven transistor is in a saturation state. So far, OLED have encountered many technical issues, wherein the most important one is aging. In the prior art, OLED are driven by DC (Direct Current). The transmission directions of electron holes (not shown) and electrons (not shown) are fixed, electron holes and electrons individually enter an emitting layer (not shown) from anode and cathode, forming excitons (not shown), then radiate light. A part of the electron holes and electrons which did not participate in light radiating may accumulate on an interface between the hole transport layer and the emitting layer, or on an interface between the electron transport layer and the emitting layer, or enter the OLED.

FIG. 1 is a detailed drawing of a sub-pixel unit of an array substrate of a prior art. A sub-pixel unit 10 comprises data line 19, gate line 18, driving source 16, and ground 15. Each sub-pixel unit 10 further comprises an LED 17 and a driving circuit 24 (the LED can also be an OLED). The driving circuit 24 comprises a first driving TFT 11 (Thin Film Transistor), a second driving TFT 12, and a storing capacitor 25. In other words, with the usage of an OLED (or LED), many electron holes and electrons will accumulate on an interface between the hole transport layer and the emitting layer, or on an interface between the electron transport layer and the emitting layer, further forming an inside electric field in the OLED or LED, making a threshold voltage of the OLED (or LED) increase, the brightness decrease, and lowers the power efficiency.

SUMMARY OF THE INVENTION

The purpose of the present invention is to provide an array substrate to increase the power efficiency and extend the life of pixel units.

To achieve the above purposes, the present invention provides an array substrate. The array substrate comprises a plurality of first pixel units and a plurality of second pixel units, the first pixel units and the second pixel units are disposed interlaced.

A first input terminal of a driving circuit of a sub-pixel unit of each of the first pixel unit receives a first pulse signal, a second input terminal of the driving circuit of the sub-pixel unit of each of the first pixel unit receives a second pulse signal. A first input terminal of a driving circuit of a sub-pixel unit of each of the second pixel unit receives the second pulse signal, a second input terminal of the driving circuit of the sub-pixel unit of each of the second pixel unit receives the first pulse signal. The phases of first pulse signal and the second pulse signal are reversed, making the first pixel units and the second pixels unit to be driven alternatingly. The cycle durations of the first pulse signal and the second pulse signal are the same as a frame cycle duration of the array substrate.

In one embodiment of the present invention, the driving circuit comprises a first driving TFT, a second driving TFT, a third driving TFT, a fourth driving TFT, and a storing capacitor.

Each sub-pixel unit of each of the first pixel unit and the second pixel unit comprises an LED, the LED comprises a first terminal and a second terminal, and the first terminal of the LED couples with a driving source.

A gate electrode of the first driving TFT couples with a gate line, a first terminal of the first driving TFT couples with a second terminal of the third driving TFT.

A first terminal of the second driving TFT couples with a second terminal of the LED, and a second terminal of the second driving TFT couples with a GND (ground).

A first terminal of the third driving TFT couples with a data line.

A first terminal and a second terminal of the fourth driving TFT couple with two terminals of the storing capacitor, and the second terminal of the fourth driving TFT couples with the GND.

A gate electrode of the second driving TFT couples with a second terminal of the first driving TFT and the first terminal of the fourth driving TFT.

The first input terminal of the driving circuit of the sub-pixel unit of each of the first pixel unit and the second pixel unit is the gate electrode of the third driving TFT, and the second input terminal of the driving circuit of the sub-pixel unit of each of the first pixel unit and the second pixel unit is the gate electrode of the fourth driving TFT.

In one embodiment of the present invention, the first terminal of the first driving TFT is a source electrode, and the second terminal of the first driving TFT is a drain electrode.

In one embodiment of the present invention, the first terminal of the second driving TFT is a source electrode, and the second terminal of the second driving TFT is a drain electrode.

In one embodiment of the present invention, the first terminal of the third driving TFT is a source electrode, and the second terminal of the third driving TFT is a drain electrode.

In one embodiment of the present invention, the first terminal of the fourth driving TFT is a source electrode, and the second terminal of the fourth driving TFT is a drain electrode.

In one embodiment of the present invention, the LED is OLED.

In one embodiment of the present invention, a display panel including the array substrate mentioned above is also provided.

To achieve the above purposes, the present invention provides an array substrate. The array substrate comprises a plurality of first pixel units and a plurality of second pixel units; the first pixel units and the second pixel units are disposed interlaced.

A first input terminal of a driving circuit of a sub-pixel unit of each of the first pixel unit receives a first pulse signal, and a second input terminal of the driving circuit of the sub-pixel unit of each of the first pixel unit receives a second pulse signal. A first input terminal of a driving circuit of a sub-pixel unit of each of the second pixel unit receives the second pulse signal, a second input terminal of the driving circuit of the sub-pixel unit of each of the second pixel unit receives the first pulse signal. The phases of first pulse signal and the second pulse signal are reversed, making the first pixel units and the second pixel units to be driven alternatingly.

In one embodiment of the present invention, the driving circuit comprises a first driving TFT, a second driving TFT, a third driving TFT, a fourth driving TFT, and a storing capacitor.

Each sub-pixel unit of each of the first pixel unit and the second pixel unit comprises an LED, the LED comprises a first terminal and a second terminal, and the first terminal of the LED couples with a driving source.

A gate electrode of the first driving TFT couples with a gate line, a first terminal of the first driving TFT couples with a second terminal of the third driving TFT.

A first terminal of the second driving TFT couples with a second terminal of the LED, and a second terminal of the second driving TFT couples with a GND.

A first terminal of the third driving TFT couples with a data line.

A first terminal and a second terminal of the fourth driving TFT couple with two terminals of the storing capacitor, and the second terminal of the fourth driving TFT couples with the GND.

A gate electrode of the second driving TFT couples with a second terminal of the first driving TFT and the first terminal of the fourth driving TFT.

The first input terminal of the driving circuit of the sub-pixel unit of each of the first pixel unit and the second pixel unit is the gate electrode of the third driving TFT, and the second input terminal of the driving circuit of the sub-pixel unit of each of the first pixel unit and the second pixel unit is the gate electrode of the fourth driving TFT.

In one embodiment of the present invention, the cycle durations of the first pulse signal and the second pulse signal are the same as a frame cycle duration of the array substrate.

In one embodiment of the present invention, the LED is OLED.

In one embodiment of the present invention, the first terminal of the first driving TFT is a source electrode, and the second terminal of the first driving TFT is a drain electrode.

In one embodiment of the present invention, the first terminal of the second driving TFT is a source electrode, and the second terminal of the second driving TFT is a drain electrode.

In one embodiment of the present invention, the first terminal of the third driving TFT is a source electrode, and the second terminal of the third driving TFT is a drain electrode.

In one embodiment of the present invention, the first terminal of the fourth driving TFT is a source electrode, and the second terminal of the fourth driving TFT is a drain electrode.

In one embodiment of the present invention, a display panel including the array substrate mentioned above is also provided.

The present invention increases the power efficiency and extends the life of a pixel unit with an alternating operation of the first pixel unit and the second pixel unit, wherein the alternating operation is based on the reversed phases of the first pulse signal and the second pulse signal.

DETAILED DESCRIPTION OF THE PREFERRED EMBODIMENTS

Figure 1:
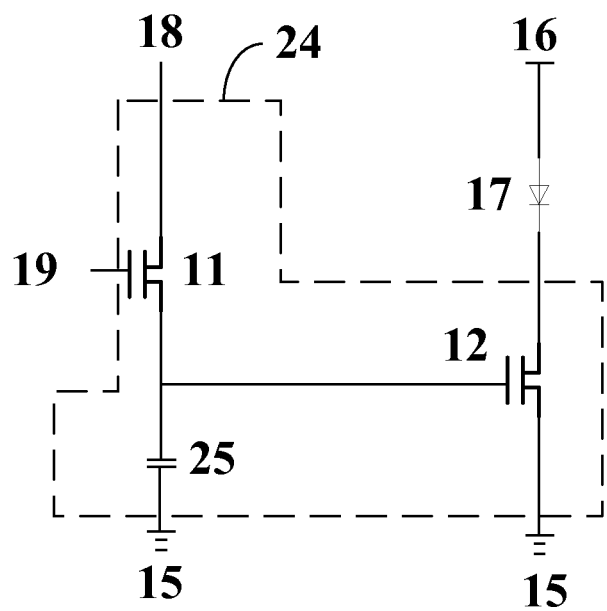
FIG. 1 is a detailed drawing of a sub-pixel unit of an array substrate of a prior art.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

Figure 2:
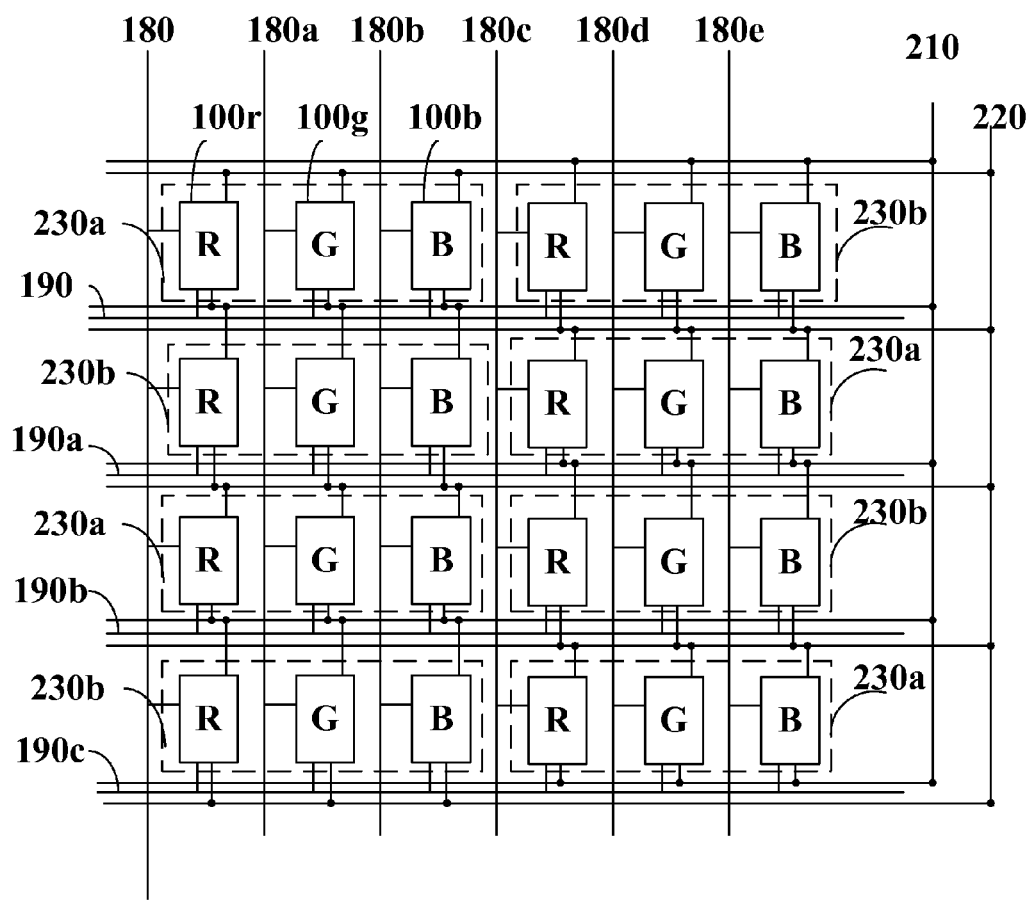
FIG. 2 is a drawing of an array of LEDs of the present invention.
Figure 3:
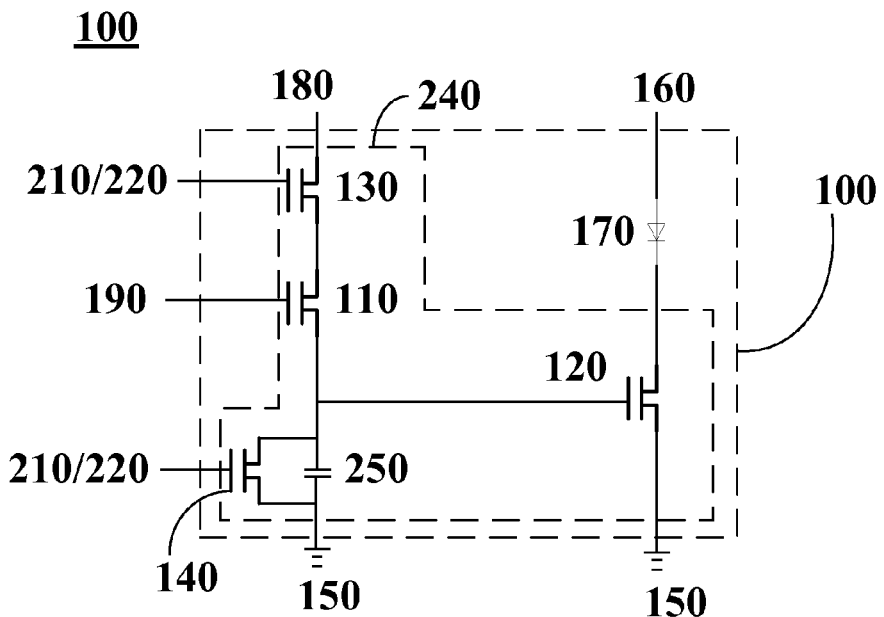
FIG. 3 is a detailed drawing of a sub-pixel unit of FIG. 2.

FIG. 2 is a drawing of an array 200 of LEDs of the present invention. FIG. 3 is a detailed drawing of a sub-pixel unit 100r, 100g, 100b (hereinafter numeral 100) of FIG. 2. An array 200 of LED comprises a plurality of pixel units 230a, 230b, a plurality of data lines 180,180a, 180b, 180c, 180d, 190e (hereinafter numeral 180), a plurality of gate lines 190, 190a, 190b, 190c, 190d (hereinafter numeral 190), a driving source 160 and a GND 150.

The pixel units 230a, 230b comprise a plurality of first pixel units 230a and a plurality of second pixel units 230b. The first pixel units 230a and the second pixel units are disposed interlaced. Each pixel unit 230a, 230b comprises at least one sub-pixel unit 100. Each sub-pixel unit 100 comprises an LED 170 and a driving circuit 240. The LED could be an ordinary LED or an OLED, etc. Each driving circuit 240 has a first driving TFT 110, a second driving TFT 120, a third driving TFT 130, a fourth driving TFT 140, and a storing capacitor 250. Each driving TFT comprises a gate electrode, a first terminal, and a second terminal. The first terminal of the driving TFT is a source electrode, the second terminal of the driving TFT is a drain electrode.

A first terminal of the LED 170 couples with a driving source 160.

A first terminal of the third driving TFT 130 couples with a data line 180.

A gate electrode of the first driving TFT 110 couples with a gate line 190, and a first terminal of the first driving TFT 110 couples with a second terminal of the third driving TFT 130.

A first terminal and a second terminal of the fourth driving TFT 140 couple with two terminals of the storing capacitor 250, and the second terminal of the fourth driving TFT 140 couples with the GND 150.

A gate electrode of the second driving TFT 120 couples with a second terminal of the first driving TFT 110 and the first terminal of the fourth driving TFT 140.

A first terminal of the second driving TFT 120 couples with a second terminal of the LED, and a second terminal of the second driving TFT 120 couples with a GND 150.

A first input terminal of a driving circuit of a sub-pixel unit of the first pixel unit 230a receives a first pulse signal 210, and a second input terminal of the driving circuit of the sub-pixel unit of the first pixel unit 230a receives a second pulse signal 220. A first input terminal of a driving circuit of a sub-pixel unit of the second pixel unit 230b receives the second pulse signal 220, a second input terminal of the driving circuit of the sub-pixel unit of the second pixel unit 230b receives the first pulse signal 210.

The first input terminal of the driving circuit 240 of the sub-pixel unit of the first pixel unit 230a and the second pixel unit 230b is the gate electrode of the third driving TFT 130; the second input terminal of the driving circuit 240 of the sub-pixel unit of the first pixel unit 230a and the second pixel unit 230b is the gate electrode of the fourth driving TFT 140.

Figure 4:
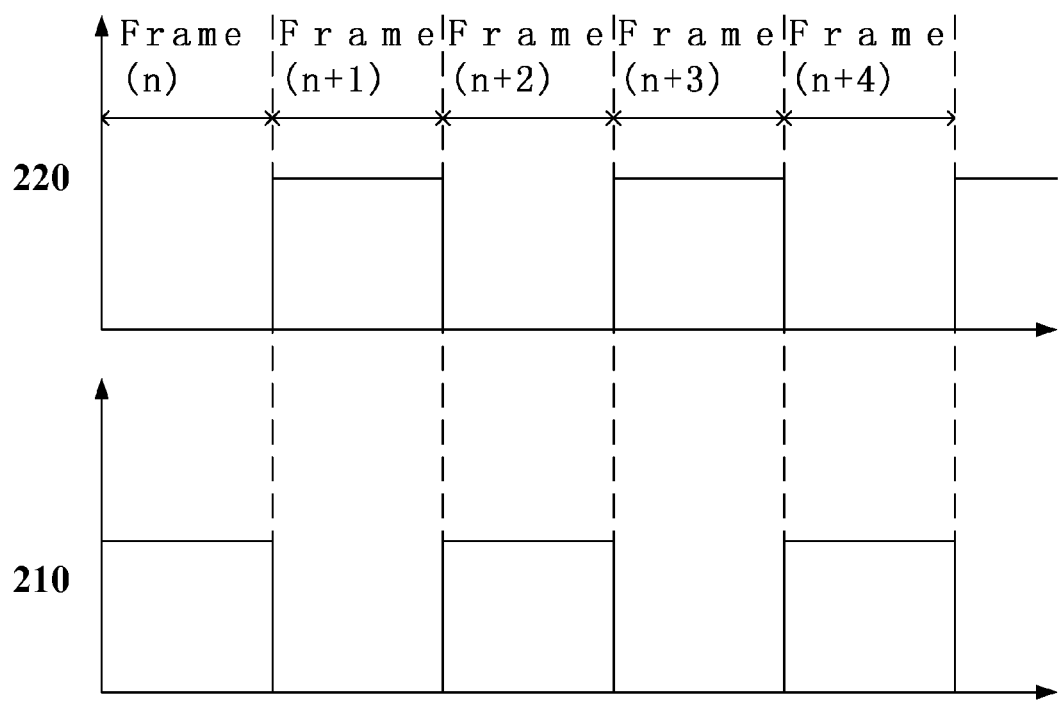
FIG. 4 is a timing diagram of a first pulse and a second pulse of the present invention.

FIG. 4 is a timing diagram of a first pulse 210 and a second pulse 220 of the present invention. As FIG. 4 shows that the phases of first pulse signal 210 and the second pulse signal 220 are reversed. The cycle durations of the first pulse signal 210 and the second pulse signal 220 are the same as a frame cycle duration of the array substrate. In other words, when the first pulse signal is high, the second pulse signal is low, and vice versa. Then, the first pixel units 230a and the second pixel units 230b can be forced to light alternatingly. For example, in frame (n), only the LEDs 170 of the first pixel units 230a are forced to light, but the LEDs 170 of the first pixel units 230b are closed. Then, in frame (n+1), the first pixel units 230a and the second pixel units 230b are alternatingly forced to light. In other words, the LEDs 170 of the second pixel units 230b are forced to light, but the LEDs 170 of the first pixel units 230a are closed. When the LEDs 170 of the first pixel units 230a and the second pixel units 230b are closed, parts of electron holes (not shown) and electrons (not shown) which did not participate in lighting are accumulated on an interface between the hole transport layer and the emitting layer, or on an interface between the electron transport layer and the emitting layer, or the electron holes and electrons will enter into the LEDs.

Figure 5:
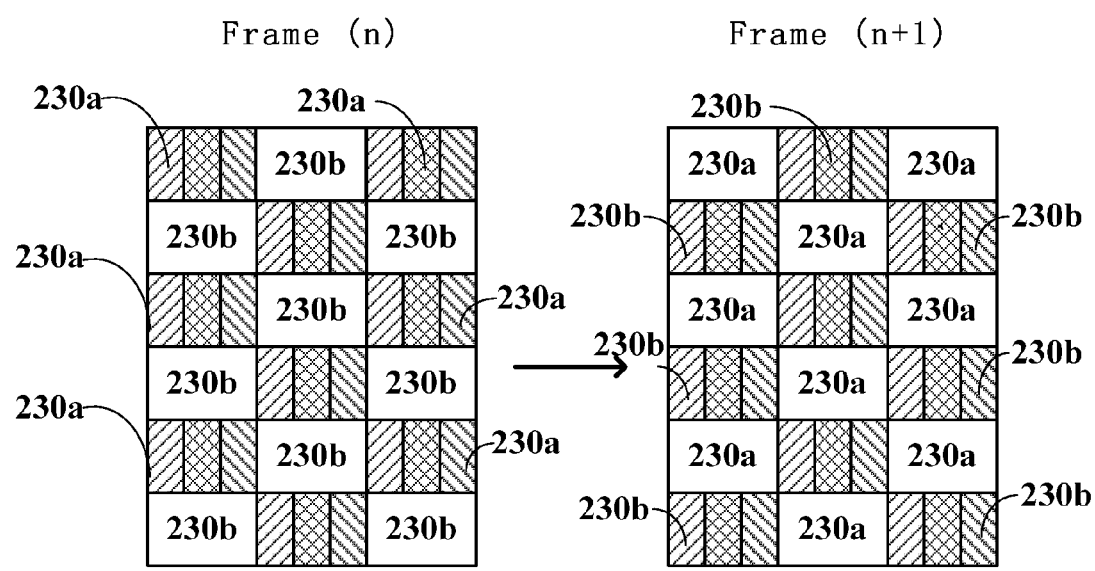
FIG. 5 is an effect diagram of an array of LEDs of the present invention.

FIG. 5 is an effect diagram of an array of LEDs of the present invention. For example, in frame (n), the first pixel units 230a are forced to light, and the second pixel units 230b are closed. In other words, two adjacent pixel units (for example, the first pixel units 230a and the second pixel units 230b) are never forced to light at the same time. The difference between frame (n) and frame (n+1) is that the situation of each pixel unit is changed (forced to light or closed). With the alternating enforcement of the LEDs 170 of the two adjacent pixel units, the increase of the threshold voltage can be avoided, further preventing the brightness of the LEDs 170 from decreasing, and increasing the power efficiency. Further, the increase of the threshold voltage of the LEDs 170 will speed the aging of the LED. Thus, the advantage of the present invention is to extend the life of the LED 170 and improve the quality of the display by reducing the increase of the threshold voltage.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. An array substrate comprising a plurality of first pixel units and a plurality of second pixel units, the first pixel units and the second pixel units are disposed interlaced; wherein
a first input terminal of a driving circuit of a sub-pixel unit of each of the first pixel unit receives a first pulse signal, a second input terminal of the driving circuit of the sub-pixel unit of each of the first pixel unit receives a second pulse signal, a first input terminal of a driving circuit of a sub-pixel unit of each of the second pixel unit receives the second pulse signal, a second input terminal of the driving circuit of the sub-pixel unit of each of the second pixel unit receives the first pulse signal, the phases of the first pulse signal and the second pulse signal are reversed, making the first pixel units and the second pixel units to be driven alternatingly, and cycle durations of the first pulse signal and the second pulse signal are the same as a frame cycle duration of the array substrate;
wherein the driving circuit comprises a first driving TFT (thin film transistor), a second driving TFT, a third driving TFT, a fourth driving TFT, and a storing capacitor;
each sub-pixel unit of each of the first pixel unit and the second pixel unit comprises an LED, the LED comprises a first terminal and a second terminal, the first terminal of the LED couples with a driving source;
a gate electrode of the first driving TFT couples with a gate line, a first terminal of the first driving TFT couples with a second terminal of the third driving TFT,
a first terminal of the second driving TFT couples with a second terminal of the LED, a second terminal of the second driving TFT couples with a GND (ground);
a first terminal of the third driving TFT couples with a data line;
a first terminal and a second terminal of the fourth driving TFT couples with two terminals of the storing capacitor, the second terminal of the fourth driving TFT couples with the GND;
a gate electrode of the second driving TFT couples with a second terminal of the first driving TFT and the first terminal of the fourth driving TFT;
the first input terminal of the driving circuit of the sub-pixel unit of each of the first pixel unit and the second pixel unit is the gate electrode of the third driving TFT, and the second input terminal of the driving circuit of the sub-pixel unit of each of the first pixel unit and the second pixel unit is the gate electrode of the fourth driving TFT.

2. The array substrate according to claim 1, wherein the LED is an OLED (organic emitting diode).

3. A display panel, wherein the display panel comprises the array substrates mentioned in claim 2.

4. The array substrate according to claim 1, wherein the first terminal of the first driving TFT is a source electrode, and the second terminal of the first driving TFT is a drain electrode.

5. The array substrate according to claim 4, wherein the first terminal of the second driving TFT is a source electrode, and the second terminal of the second driving TFT is a drain electrode.

6. The array substrate according to claim 5, wherein the first terminal of the third driving TFT is a source electrode, and the second terminal of the third driving TFT is a drain electrode.

7. The array substrate according to claim 6, wherein the first terminal of the fourth driving TFT is a source electrode, and the second terminal of the fourth driving TFT is a drain electrode.

8. A display panel, wherein the display panel comprises the array substrates mentioned in claim 7.

9. A display panel, wherein the display panel comprises the array substrates mentioned in claim 6.

10. A display panel, wherein the display panel comprises the array substrates mentioned in claim 5.

11. A display panel, wherein the display panel comprises the array substrates mentioned in claim 4.

12. A display panel, wherein the display panel comprises the array substrates mentioned in claim 1.

13. A display panel, wherein the display panel comprises the array substrates mentioned in claim 1.

14. An array substrate comprising a plurality of first pixel units and a plurality of second pixel units, the first pixel units and the second pixel units are disposed interlaced; wherein a first input terminal of a driving circuit of a sub-pixel unit of each of the first pixel unit receives a first pulse signal, a second input terminal of the driving circuit of the sub-pixel unit of each of the first pixel unit receives a second pulse signal, a first input terminal of a driving circuit of a sub-pixel unit of each of the second pixel unit receives the second pulse signal, a second input terminal of the driving circuit of the sub-pixel unit of each of the second pixel unit receives the first pulse signal, the phases of first pulse signal and the second pulse signal are reversed, making the first pixel units and the second pixel units to be driven alternatingly;

wherein the driving circuit comprises a first driving TFT (thin film transistor), a second driving TFT, a third driving TFT, a fourth driving TFT, and a storing capacitor;

each sub-pixel unit of each of the first pixel unit and the second pixel unit comprises an LED, the LED comprises a first terminal and a second terminal, the first terminal of the LED couples with a driving source;

a gate electrode of the first driving TFT couples with a gate line, a first terminal of the first driving TFT couples with a second terminal of the third driving TFT, a first terminal of the second driving TFT couples with a second terminal of the LED, a second terminal of the second driving TFT couples with a GND (ground);

a first terminal of the third driving TFT couples with a data line;

a first terminal and a second terminal of the fourth driving TFT couples with two terminals of the storing capacitor, the second terminal of the fourth driving TFT couples with the GND;

a gate electrode of the second driving TFT couples with a second terminal of the first driving TFT and the first terminal of the fourth driving TFT;

the first input terminal of the driving circuit of the sub-pixel unit of each of the first pixel unit and the second pixel unit is the gate electrode of the third driving TFT, and the second input terminal of the driving circuit of the sub-pixel unit of each of the first pixel unit and the second pixel unit is the gate electrode of the fourth driving TFT.

15. The array substrate according to claim 14, wherein the cycle durations of the first pulse signal and the second pulse signal are the same as a frame cycle duration of the array substrate.

16. A display panel, wherein the display panel comprises the array substrates mentioned in claim 15.

17. The array substrate according to claim 14, wherein the LED is an OLED.

18. A display panel, wherein the display panel comprises the array substrates mentioned in claim 17.

19. The array substrate according to claim 14, wherein the first terminal of the first driving TFT is a source electrode, and the second terminal of the first driving TFT is a drain electrode.

20. The array substrate according to claim 19, wherein the first terminal of the second driving TFT is a source electrode, and the second terminal of the second driving TFT is a drain electrode.

21. The array substrate according to claim 20, wherein the first terminal of the third driving TFT is a source electrode, and the second terminal of the third driving TFT is a drain electrode.

22. The array substrate according to claim 21, wherein the first terminal of the fourth driving TFT is a source electrode, and the second terminal of the fourth driving TFT is a drain electrode.

23. A display panel, wherein the display panel comprises the array substrates mentioned in claim 22.

24. A display panel, wherein the display panel comprises the array substrates mentioned in claim 21.

25. A display panel, wherein the display panel comprises the array substrates mentioned in claim 20.

26. A display panel, wherein the display panel comprises the array substrates mentioned in claim 19.

27. A display panel, wherein the display panel comprises the array substrates mentioned in claim 14.

28. A display panel, wherein the display panel comprises the array substrates mentioned in claim 14.

\* \* \* \* \*